United States Patent [19]

Peebles, Jr. et al.

[11] 4,245,196
[45] Jan. 13, 1981

[54] HIGHLY-LINEAR CLOSED-LOOP FREQUENCY SWEEP GENERATOR

[75] Inventors: Peyton Z. Peebles, Jr., Knoxville, Tenn.; Augustus H. Green, Jr., Huntsville, Ala.

[73] Assignee: The United States of America as represented by the Secretary of the Army, Washington, D.C.

[21] Appl. No.: 62,099

[22] Filed: Jul. 30, 1979

[51] Int. Cl.³ .................... H03B 23/00; H03L 7/08
[52] U.S. Cl. ............................ 331/178; 331/4; 331/17
[58] Field of Search ................... 331/4, 17, 178

[56] References Cited

U.S. PATENT DOCUMENTS

| | | | |
|---|---|---|---|
| 3,621,450 | 11/1971 | Blair et al. | 331/178 X |
| 3,699,448 | 10/1972 | Martin et al. | 331/178 X |
| 4,038,612 | 7/1977 | Borofka et al. | 331/4 X |

OTHER PUBLICATIONS

Bromaghim et al., "A Wideband Linear FM Ramp Generator for the Long-Range Imaging Radar", IEEE Trans. on Microwave Theory and Techniques, vol. MTT-26, May 1978, pp. 322-325.

Caputi, "Stabilized Linear FM Generator", IEEE Trans. on Aerospace and Electronic Systems, vol. AES-9, No. 5, Sep. 1973, pp. 670-678.

Hoffman et al., "A 94-GHz Radar for Space Object Identification", IEEE Trans. on Microwave Theory and Techniques, vol. MTT-17, No. 12, Dec. 1969, pp. 1145-1149.

*Primary Examiner*—Siegfried H. Grimm
*Attorney, Agent, or Firm*—Nathan Edelberg; Robert P. Gibson; Robert C. Sims

[57] ABSTRACT

A method is presented for generating highly-linear periodic frequency sweeps by providing closed-loop linearity corrections for linear frequency sweeps that are error averaged over a number of sweeps. The technique can operate with a variable sweep period.

4 Claims, 4 Drawing Figures

HIGHLY-LINEAR CLOSED-LOOP FREQUENCY SWEEP GENERATOR

DEDICATORY CLAUSE

The invention described herein may be manufactured, used, and licensed by or for the Government for governmental purposes without the payment to us of any royalties thereon.

BACKGROUND OF THE INVENTION

A voltage controlled oscillator (VCO) is an oscillator with output frequency that varies ideally as a linear function of an input dc (or slowly varying voltage). In practice the variation is not perfectly linear and output frequency can be different from the ideal linear value desired. The difference may be called frequency errors and the errors arise from nonlinearities in the VCO's "characteristic" frequency/voltage response function.

One of the most useful applications of VCO's is in generating linear frequency sweeps. Typically the input to the VCO is a periodic sequence of voltage ramps resembling a sawtooth function. For each linear portion of the input signal the output VCO frequency should vary from some minimum value to some maximum value in ideally a linear manner. The same instantaneous frequency behavior would repeat for each frequency sweep interval. In practice the "linear" sweep contains errors because of the nonlinearities in the VCO's characteristic. Since the sweep voltage is periodic and the VCO characteristic does not change from sweep-to-sweep, the instantaneous frequency errors are periodic. This fact is important to the ideas embodied in the new invention.

Several ways exist for reducing the sweep nonlinearities. Of these, those that utilize a closed loop approach provide the most improvement. Of the closed-loop methods available, the phase-locked loop will generate about the most linear frequency sweeps possible.

DESCRIPTION OF THE PREFERRED EMBODIMENT

Figure 1:
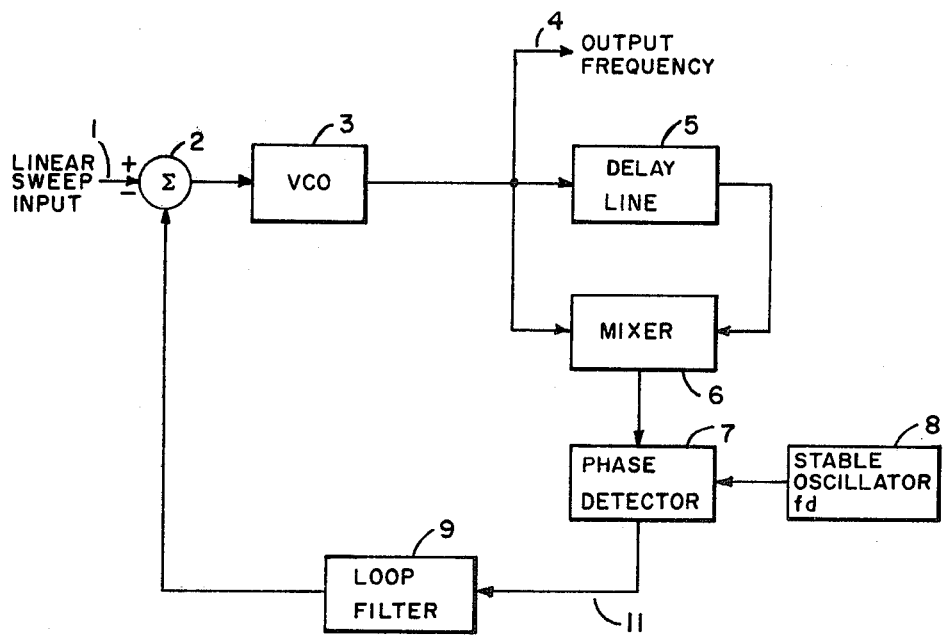
FIG. 1 is a block diagram showing the basic sweep generator correction circuit.

A phased-locked linear sweep generating loop is illustrated in FIG. 1 in its most basic conceptual form (some additional mixing, gating, and filtering operations are commonly required in a practical system, but these functions do not need to be shown in order to understand basic operation). A linear periodic sawtooth voltage 1 is applied through a difference amplifier 2 to the VCO 3. If no linearity errors were present, the output frequency 4 would be ideal and the feedback voltage from the loop filter 9 would be ideally zero.

When nonlinearities are present, the remaining elements in the loop of FIG. 1 are designed to develop a voltage proportional to the instantaneous errors so that it can be applied to the VCO (with sign reversal) to reduce the errors. We next describe how the error voltage is generated.

The output of the VCO 3 is delayed a small amount in a delay line 5. The delayed and undelayed signals are applied to a mixer 6 that produces an output having a frequency equal to the difference in the instantaneous frequencies of the undelayed and delayed inputs. Because of the "linear" form of these inputs, the difference frequency is a constant $f_d$ except for variations due to VCO nonlinearities. For small errors (as would be the case when the loop is working properly) the difference-frequency output of the mixer 6 and the output of a constant-frequency stable oscillator 8 are applied to a phase detector 7. The output 11 of the detector 7 will be a voltage proportional to instantaneous VCO frequency errors. This voltage is amplified by the loop filter 9, which may also contain some filtering operations necessary to produce a stable loop, and its output is finally reapplied to the VCO 3 via a difference amplifier 2 to give a reduction of errors.

The loop of FIG. 1 must be nearly instantaneous. That is, error correction must be done on a nearly instantaneous basis derived from instantaneous measurements made on the output of the phase detector 7. However, this output is not exactly proportional to frequency errors. It is only approximately proportional; the approximation is usually good because the delay in the delay line 5 is usually small (the approximation becomes more accurate as delay gets smaller). One of the principal functions of the new invention is to relieve the errors inherent in assuming the output of the phase detector 7 is truly proportional to VCO frequency errors when it is not.

Another disadvantage of the basic loop of FIG. 1 is that no provision is possible for averaging a sequence of measurements of VCO frequency errors (at the phase detector's output) in order to improve the accuracy of measurement and reduce the effects of noise. The new invention eliminates this disadvantage and allows a new degree of freedom in loop design by allowing averaging.

Figure 2:
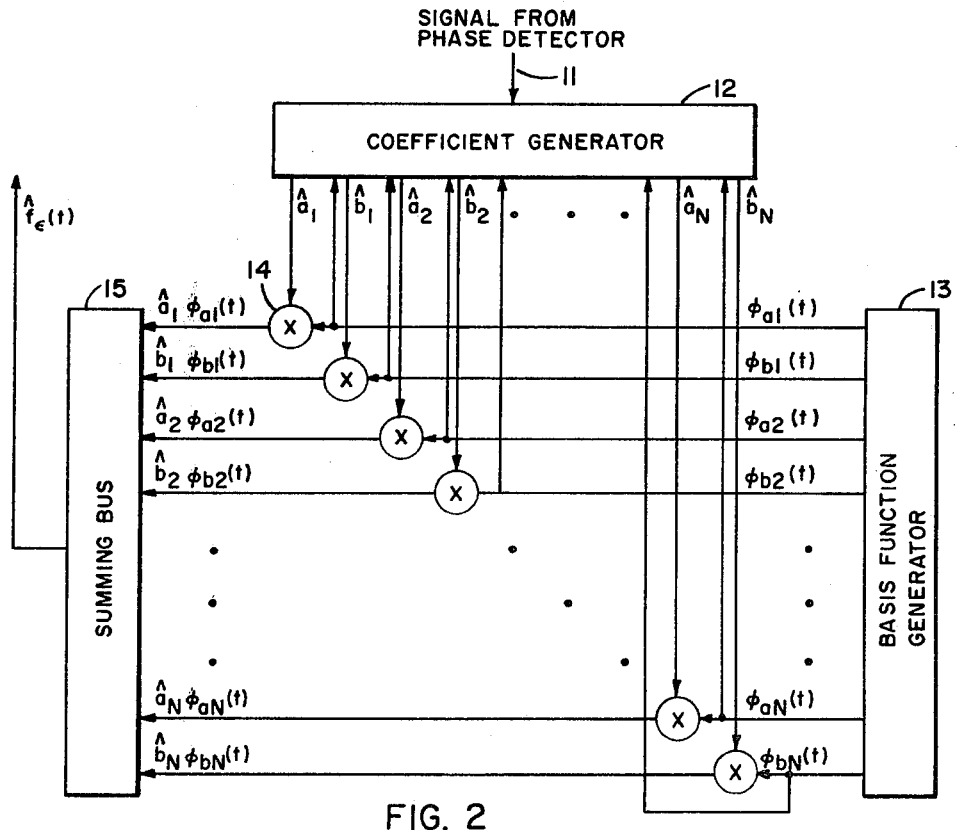
FIG. 2 is a block diagram showing the averaging error generator of the present invention.
Figure 3:
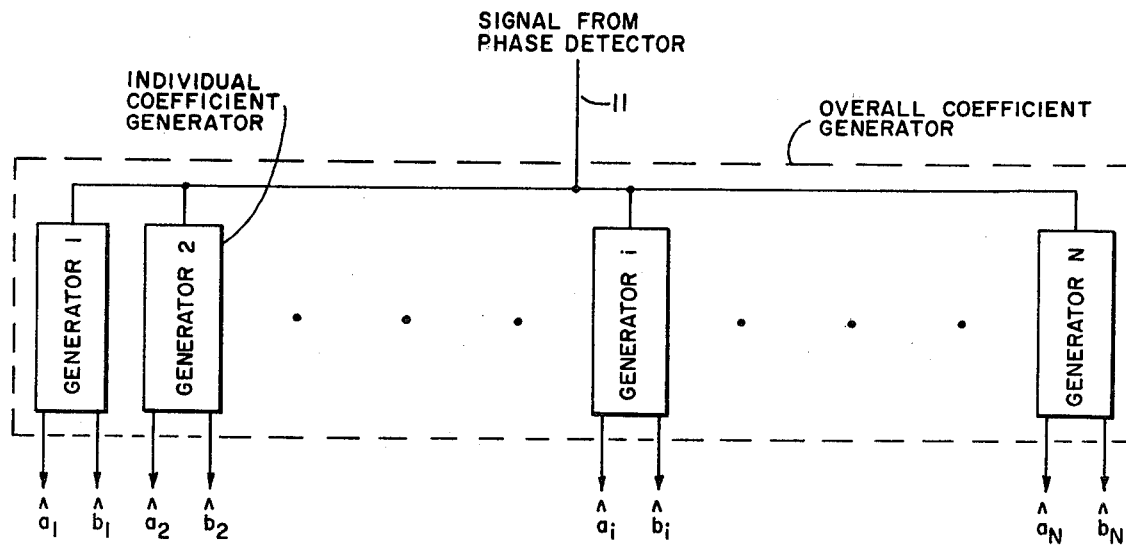
FIG. 3 is a block diagram showing the coefficient generator of the present invention.

The new invention consists of changing the loop of FIG. 1 by replacing the usual loop filter 9 by a new function called an averaging error generator (AEG). The AEG is illustrated in FIG. 2 and its operation is next explained.

The AEG is comprised of three major operations. The first, and most important, operation is performed by the coefficient generator 12. Because the frequency error in the VCO sweep is periodic (with period T), it can be expressed by a Fourier series. If $f_\epsilon(T)$ represents the frequency error with time, the Fourier series can be written as:

$$f_\epsilon(t) = \sum_{i=1}^{N} [a_i \phi_{ai}(t) + b_i \phi_{bi}(t)]$$

where the coefficients $a_i$ and $b_i$ $i=1,2,\ldots,N$, are the Fourier series coefficients and $\phi_{ai}(t) = \cos(i2\pi t/T), i=1,2,\ldots,N,$
$\phi_{bi}(t) = \sin(i2\pi t/T), i=1,2,\ldots,N,$ are orthogonal basis functions. The series for $f_\epsilon(t)$ contains only N frequencies $i/T$ because there will always be some value of N for which frequencies above N/T can be neglected. The principal function of the coefficient generator is to make estimates $a_i$ and $b_i$ of the coefficients $\hat{a}_i$ and $\hat{b}_i$, respectively, that make up $f_\epsilon(t)$ through its Fourier series. Ideally, if noise was not present in the system, $\hat{a}_i = a_i$ and $\hat{b}_i = b_i$ would be true.

Figure 4:
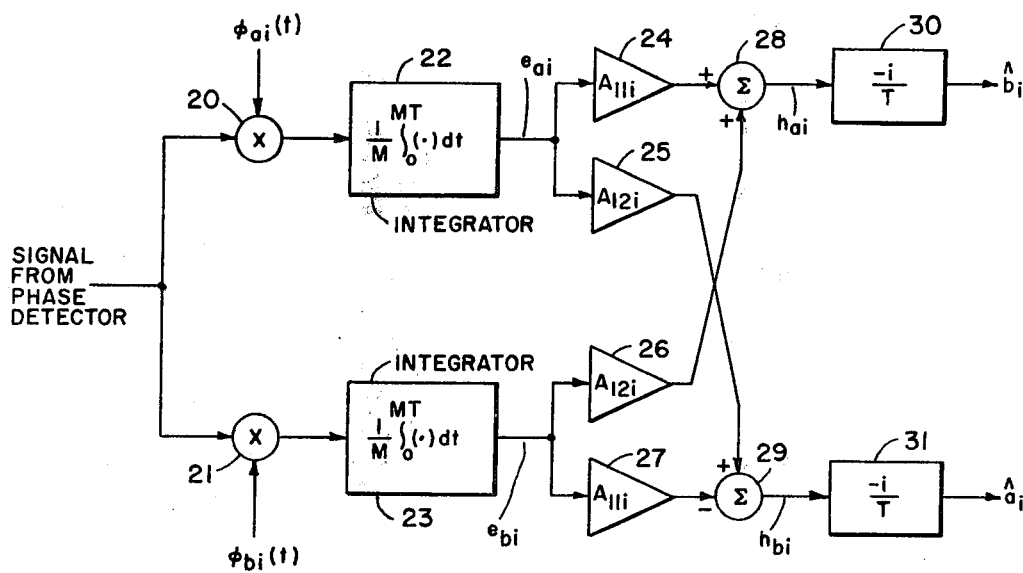
FIG. 4 is a schematic showing of one of the individual generators shown in FIG. 3.

The coefficient generator is made up of N individual coefficient generators as shown in FIG. 4. The signal 11 from the phase detector (7 of FIG. 1) is fed to multipiers 20 and 21 where is it multiplied by either $\phi_{ai}(t)$ or $\phi_{bi}(t)$, depending on path chosen, and the results are integrated over M periods of sweeps by integrators 22 and 23 to produce signals $e_{ai}$ and $e_{bi}$ in FIG. 4. The signals $e_{ai}$ and $e_{bi}$ are next weighted (multiplied) by gain factors $A_{11i}$ and $A_{12i}$ in amplifiers 24–27 to produce four signals that are then summed by summers 28 and 29 to produce two signals $h_{ai}$ and $h_{bi}$. Finally, the coefficient estimates are generated by amplifiers 30 and 31 according to $$\hat{b}_i = \frac{-i}{T} h_{ai}$$
$$\hat{a}_i = \frac{-i}{T} h_{bi}.$$

The weighting coefficients are defined by $$A_{11i} = \frac{2}{K_D T} \left[ \frac{1 - \alpha_{di}}{(1 - \alpha_{di})^2 + \beta_{di}^2} \right]$$

$$A_{12i} = \frac{2}{K_D T} \left[ \frac{-\beta_{di}}{(1 - \alpha_{di})^2 + \beta_{di}^2} \right]$$

where $\alpha_{di} = \cos(2\pi t_d/T)$
$\beta_{di} = \sin(2\pi t_d/T)$
$t_d$ = delay of delay line
$K_d$ = slope of phase detector's response.

All the above equations apply for $i = 1, 2, \ldots, N$.

The orthogonal basis functions required in the coefficient generator originate in the basis function generator 13 of FIG. 2. Any of the known function generators can be used. The second major operation of the AEG is performed by the basis function generator 13. Procedures for generating $\phi_{ai}(t)$ and $\phi_{bi}(t)$ are many and well-known. Since these functions are simple sines and cosines at the various harmonic frequencies $i/T, i = 1, 2, \ldots, N$, all that is required in the basis function generator is a bank of N phase-locked oscillators with N 90-degree phase shifters.

The third major operation of the AEG consists of summing (in the summing bus 15 in FIG. 2) 2 N signals that are the products of outputs from the coefficient generator (12 of FIG. 2) and the basis function generator (13 of FIG. 2). The final signal $\hat{f}_\epsilon(t)$ is sent to the difference amplifier (2 of FIG. 1), is $$\hat{f}_\epsilon(t) = \sum_{i=1}^{N} [a_i \phi_{ai}(t) + b_i \phi_{bi}(t)].$$

This signal will be a close approximation of $f_\epsilon(t)$ and can be considered an estimate of $f_\epsilon(t)$. Ideally, with no noise present, $\hat{f}_\epsilon(t) = f_\epsilon(t)$.

Because the basis functions are orthogonal, periodic, and are known, while the coefficients $a_i$ and $b_i$ that define $f_\epsilon(t)$ are nearly constant, the coefficient generator (12, FIG. 2) can average over $M > 1$ periods of the sweep as indicated in FIG. 4 by the integration taking place over M periods. Thus, long-term averaging can be done in estimating the coefficients of $f_\epsilon(t)$, which results in a narrow-band operation. The only requirement for good performance is that the most rapidly varying coefficient of $f_\epsilon(t)$ be slowly varying in a time interval MT.

Final system linearity improvement is a function of the accuracy with which the coefficients $\hat{a}_i$ and $\hat{b}_i$ are determined and the number N of components of approximation for $f_\epsilon(t)$ that is implemented.

Finally, we comment that the invention will work in frequency-locked loops where the mixer 6 in FIG. 1 is replaced by a discriminator (the stable oscillator 8 is also eliminated), if the constants $-i/T$ in FIG. 4 are replaced by unity. The input to the AEG of FIG. 2 now becomes the signal from the discriminator.

We claim:

1. In a system for controlling the linearity of a voltage controlled oscillator whose output is to sweep periodically in a linear fashion between two frequency values, the improvement comprising the method of detecting errors in the sweep of the voltage controlled oscillator; averaging these errors over a plurality of sweeps; and sending the average of the errors back to the voltage controlled oscillator so as to correct its output.

2. A method is set forth in claim 1 further comprising the steps of breaking down the errors into a plurality of coefficients; and summing these coefficients so as to obtain the average error.

3. A method is set forth in claim 2 further comprising the step of weighting the coefficients according to predetermined characteristics.

4. A method is set forth in claim 3 further comprising the steps of generating orthogonal basis function coefficients in accordance with the errors of the sweep of the voltage controlled oscillator; and combining these signals with the basis functions before summing them to send to control the voltage controlled oscillator.

* * * * *